US011275108B2

(12) United States Patent
Chen (10) Patent No.: US 11,275,108 B2
(45) Date of Patent: Mar. 15, 2022

(54) DISPLAY DEVICE AND TESTING METHOD FOR DISPLAY PANEL

(71) Applicants: HKC CORPORATION LIMITED, Shenzhen (CN); CHONGQING HKC OPTOELECTRONICS TECHNOLOGY CO.,LTD., Chongqing (CN)

(72) Inventor: Wei Chen, Chongqing (CN)

(73) Assignees: HKC Corporation Limited, Shenzhen (CN); Chongqing HKC Optoelectronics Technology Co., Ltd., Chongqing (CN)

( * ) Notice: Subject to any disclaimer, the term of this patent is extended or adjusted under 35 U.S.C. 154(b) by 299 days.

(21) Appl. No.: 16/475,783

(22) PCT Filed: Aug. 10, 2017

(86) PCT No.: PCT/CN2017/096864
§ 371 (c)(1),
(2) Date: Jul. 3, 2019

(87) PCT Pub. No.: WO2018/188238
PCT Pub. Date: Oct. 18, 2018

(65) Prior Publication Data
US 2019/0362662 A1   Nov. 28, 2019

(30) Foreign Application Priority Data

Apr. 11, 2017 (CN) .......................... 201710233641.5

(51) Int. Cl.
*G01R 31/28* (2006.01)
*G09G 3/00* (2006.01)
*H04N 17/00* (2006.01)
*G02F 1/13* (2006.01)

(52) U.S. Cl.
CPC ..... *G01R 31/2825* (2013.01); *G01R 31/2803* (2013.01); *G09G 3/006* (2013.01); *H04N 17/00* (2013.01); *G02F 1/1309* (2013.01)

(58) Field of Classification Search
CPC ............ G01R 31/2825; G01R 31/2803; G09G 3/006; H04N 17/00
USPC .............. 345/77, 87, 204, 213; 348/92, 790; 382/141
See application file for complete search history.

(56) References Cited

U.S. PATENT DOCUMENTS

| | | | | |
|---|---|---|---|---|
| 6,055,145 A * | 4/2000 | Lagree | ...................... | G06J 1/00 361/115 |
| 6,215,294 B1* | 4/2001 | Coleman | ............ | G01R 29/0842 324/72 |
| 2004/0012580 A1* | 1/2004 | Yamagishi | ........... | G09G 3/3688 345/204 |

(Continued)

FOREIGN PATENT DOCUMENTS

CN            106504687 A   *   4/2018   ............. G09G 3/006

*Primary Examiner* — Prabodh M Dharia
(74) *Attorney, Agent, or Firm* — Wang Law Firm, Inc.

(57) ABSTRACT

A display device and a testing method for a display panel are provided. The testing method for the display panel includes the steps of: storing an image signal for controlling the display panel to display a default image in a driver chip of the display panel, providing a power signal and a clock signal to the display panel, and retrieving the image signal and testing the display panel according to a preset test condition.

20 Claims, 6 Drawing Sheets

(56) References Cited

U.S. PATENT DOCUMENTS

| | | | | |
|---|---|---|---|---|
| 2004/0227708 A1* | 11/2004 | Huelson | .................. | G09G 3/14 |
| | | | | 345/77 |
| 2006/0001781 A1* | 1/2006 | Uehara | ................. | G09G 5/003 |
| | | | | 348/790 |
| 2006/0120588 A1* | 6/2006 | Kwon | .................... | G09G 3/006 |
| | | | | 382/141 |
| 2008/0036715 A1* | 2/2008 | Lee | ....................... | G09G 3/006 |
| | | | | 345/87 |
| 2012/0026315 A1* | 2/2012 | Lee | ....................... | G09G 3/006 |
| | | | | 348/92 |
| 2016/0267842 A1* | 9/2016 | Zhang | ................. | G09G 3/3233 |
| 2018/0218692 A1* | 8/2018 | Zeng | ....................... | G09G 5/18 |

* cited by examiner

DISPLAY DEVICE AND TESTING METHOD FOR DISPLAY PANEL

CROSS-REFERENCE TO RELATED APPLICATION

This application claims priority to China Patent Application No. 201710233641.5 filed on Apr. 11, 2017, and entitled "Display device and testing method for display panel" at State Intellectual Property Office of the P.R.C, the entirety of which is hereby incorporated by reference.

BACKGROUND OF THE INVENTION

1. Field of the Invention

The present application relates to display panel technology, and especially relates to a display device and a testing method for a display panel.

2. Description of the Related Art

In a current production line, a liquid-crystal display (LCD) has to go through a procedure of high temperature and high moisture tests after finishing wire bonding to ensure its durability. At this moment, there is only a connection board but no timer-control-register board (TCON, logic board) disposed on the display panel. In order to light up the display panel in this procedure, a TCON board is required as a lighting jig for signal transmission. Extra labor force is therefore required to connect the TCON board and the connection board, and TCON board is frequently damaged after repeat uses in tests.

SUMMARY OF THE INVENTION

In order to resolve the current technical issues of extra labor force requirement for connecting the TCON board and the connection board and frequent damages of the logic board after repeat uses in tests, the embodiments of the present application provide a display device and a testing method for a display panel.

The embodiment of the present application provides a testing method for a display panel, including the steps of:
storing an image signal for controlling the display panel to display a default image in a driver chip of the display panel;
providing a power signal and a clock signal to the display panel; and
retrieving the image signal and testing the display panel based on the image signal and the clock signal according to a preset test condition.

Optionally, the step of testing the display panel according to the preset test condition is to test the display panel according to a preset time.

Optionally, different kinds of display panels correspond to different preset times, and a time requirement for the test is preset for each kind of display panels.

Optionally, the step of testing the display panel according to the preset test condition is to test the display panel according to a duration of each default image, a display sequence of each default image, and a number of times of each default image.

Optionally, the step of testing the display panel according to the preset test condition is to test the display panel according to a preset voltage and a preset current.

Optionally, the display panel of a display device is tested according to the first preset voltage and the first preset current and the display panel of a mobile phone or a tablet computer is tested according to the second preset voltage and the second preset current.

Wherein, the first preset voltage is greater than the second preset voltage, and the first preset current is greater than the second preset current.

Optionally, the step of testing the display panel according to the preset test condition is to test the display panel according to a preset time, a preset voltage, and a preset current.

Optionally, before retrieving the image signal, the method further includes: detecting a test signal, and after the test signal is detected, providing the power and clock signals required by the display panel, and retrieving the image signal.

Optionally, the method further includes:
retrieving the image signal and combining the clock signal to convert the image signal into a display control signal; and
driving the display panel to display the default image based on the display control signal.

Optionally, the step of driving the display panel to display the default image based on the display control signal is to drive the display panel to display a plurality of different default images based on the display control signal, wherein each default image has a corresponding duration, a corresponding display sequence, and a corresponding number of display times.

Optionally, the method further includes: measuring and recording a performance parameter of the display panel.

Optionally, the step of measuring and recording the performance parameter of the display panel is measuring and recording a luminance and/or a resolution of the display panel.

Optionally, the method further includes: real-time measuring and recording a performance parameter of the display panel.

Optionally, the display panel is provided with the power and the clock signal by an external power board.

An embodiment of the present application further provides a display device, including a processor and a display panel.

The processor is configured to store an image signal for controlling the display panel to display a default image.

The processor is further configured to connect an external power and a clock signal to provide a power and the clock signal to the display panel.

The processor further configured to retrieve the image signal and test the display panel based on the image signal and the clock signal according to a preset test condition.

The display panel is configured to display the default image based on a control of the processor.

Optionally, the processor is configured to retrieve the image signal, covert the image signal into a data voltage, and drive the display panel to display the default image based on the data voltage and the clock signal.

Optionally, the processor further includes:
a driver module, which is configured to store the image signal for controlling the display panel to display the default image;
an interface module, which is configured to connect the external power and the clock signal for providing the power and the clock signal to the display panel;

an execution module, which is configured to retrieve the image signal and test the display panel based on the image signal and the clock signal according to the preset test condition; and a display module is configured to display the default image based on the control of the execution module.

Optionally, the execution module further includes:

a conversion unit, which is configured to retrieve the image signal and convert the image signal into a data voltage; and a driver unit, which is configured to drive the display panel to display the default image based on the data voltage and the clock signal.

An embodiment of the present application further provides a testing method for a display panel, including:

storing an image signal for controlling the display panel to display a default image in a driver chip of the display panel;

providing a power and a clock signal to the display panel by an external power board; and retrieving the image signal and testing the display panel based on the image signal and the clock signal according to a preset voltage and a preset current.

Optionally, the method further includes:

retrieving the image signal and combining the clock signal to convert the image signal into a display control signal; and driving the display panel to display the default image based on the display control signal.

Optionally, the step of driving the display panel to display the default image based on the display control signal is to drive the display panel to display a plurality of different default images based on the display control signal, wherein each default image has a corresponding duration, a corresponding display sequence, and a corresponding number of display times.

In the embodiments of the present application, the image signal is pre-stored in the driver chip of the display panel, and the driver chip of the display panel is directly accessed to retrieve the image signal during testing the display panel, which discards the use of the TCON board for providing the image signal, thereby reducing the cost and resolving the issue of frequent damages of the TCON board after repeat uses in tests.

BRIEF DESCRIPTION OF THE DRAWINGS

In order to illustrate a technical solution more clearly in the embodiments of the present application, drawings that are necessary for the description of the embodiments or current techniques will be briefly set forth in the following. It is obvious that the drawings in the following description illustrate only some embodiments of the present application. A person skilled in the art may obtain other drawings based on these drawings without any expenditure of inventive labors.

DESCRIPTION OF THE PREFERRED EMBODIMENTS

The following description provides specific details of particular system structures, techniques, etc. to represent but not to limit the present application, such that the present application can be thoroughly comprehended. However, a person skilled in the art should understand that the application can also be implemented by other embodiments without these specific details. In other situations, well-known systems, devices, circuits, and methods are exempt from detailed description to avoid the unnecessary details hindering the description of the present application.

The following adopts specific embodiments to present the technical solutions according to the present application.

Figure 1:
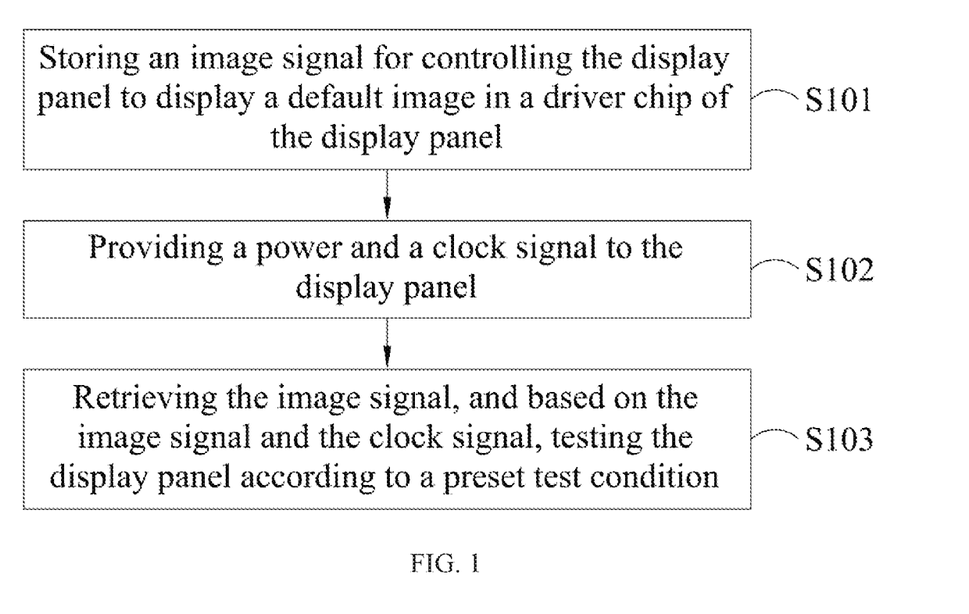
FIG. 1 is a schematic diagram showing a flow chart of a testing method for a display panel provided in an embodiment of the present application.

FIG. 1 illustrates a flow chart to carry out a testing method for a display panel provided in an embodiment of the present application, which is detailed as follows.

A step S101 includes storing an image signal for controlling the display panel to display a default image in a driver chip of the display panel.

In this embodiment, the image signal is capable to prompt the display panel to display the default image under the external power and the clock signal. For example, under the external power and the clock signal, the display panel displays an image having a certain color, a certain figure, several kinds of figures, etc.

Provided with the image signal through a TCON board, the display panel can be lit up under the external power and the clock signal to display the default image. However, in this step, the image signal is pre-stored in the driver chip of the display panel, and the driver chip of the display panel is directly accessed to retrieve the image signal during testing the display panel, which discards the use of the TCON board for providing the image signal, thereby reducing the cost and resolving the issue of frequent damages of the TCON board after repeat uses in tests.

A step S102 includes providing a power and the clock signal to the display panel.

Figure 2:
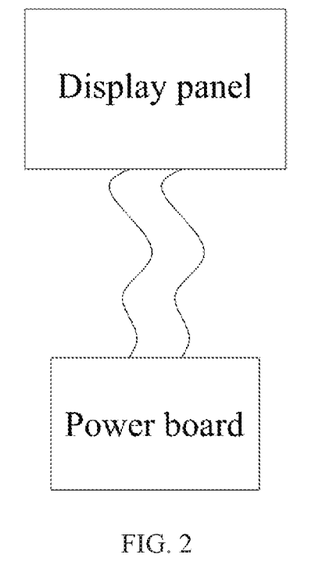
FIG. 2 is a schematic diagram showing a connection between a display panel and a power board provided in an embodiment of the present application.

As an embodiment shown in FIG. 2, an external power board can provide the power and the clock signal to the display panel. To be specific, the power output leads of the power board connect the power input leads of the display panel through wiring, and the clock signal output leads of the power board connect the clock signal input leads of the display panel through wiring, and the power board supplies required voltage, current, and the clock signal to the display panel for the test.

A step S103 includes retrieving the image signal and, based on the image signal and the clock signal, testing the display panel according to a preset test condition.

In some embodiments, the step of testing the display panel according to the preset test condition can specifically be testing the display panel according to a preset time.

Wherein, the time requirement for testing each one of various kinds of display panels can be preset to perform a preset time test on the display panel for verifying the performance of the display panel. In this embodiment, the preset time is given based on practical situations, and different kinds of display panels have their corresponding preset times different. For example, a display panel for a display device can be appointed with a longer preset time, and a display panel for a mobile phone, or a tablet computer can be appointed with a shorter preset time, but the embodiment is not limited to this.

Optionally, the step of testing the display panel according to the preset time can specifically be testing the display panel according to a duration of each default image, a display sequence of each default image, and a number of times of each default image.

Wherein, during the display panel test procedure, in order to have a more thorough and accurate test on the display panel, the display panel may be required to display different default images with each default image having a corresponding duration, a position in the sequence, and a corresponding number of times being displayed.

For example, during the test procedure, the display panel is required to display a red image N1 times each with a duration of M1 seconds, a green image N2 times each with a duration of M2 seconds, a blue image N3 times each with a duration of M3 seconds, and a grey image N4 times each with a duration of M4 seconds, and to stop working N5 times each with a duration of M5 seconds. Wherein, N1, N2, N3, N4, and N5 are equal, which means the display panel is tested with a sequence of, but not limited to, displaying the red image, the green, the blue image, and the gray image, and stopping working.

In another embodiment, the step of testing the display panel according to the preset test condition can specifically be testing the display panel according to the preset voltage and the preset current.

Wherein, voltage and current requirements for testing each display panel can be preset to perform preset voltage and preset current tests on the display panel for verifying the performance of the display panel. In this embodiment, the preset voltage and preset current can be set up based on practical situations, and different kinds of display panels have their corresponding preset voltages and preset currents totally or partially different. For example, a display panel for a display device can be appointed with a greater preset voltage and preset current, and a display panel for a mobile phone or a tablet computer can be appointed with a lesser preset voltage and preset current, but the embodiment is not limited to this.

Moreover, the preset time, preset voltage, and the preset current can be combined to test the display panel. Specifically, the preset time, preset voltage, and the preset current are given based on practical situations, and different kinds of display panels have their corresponding preset time, preset voltages, and preset currents totally or partially different. For example, a display panel for a display device can be appointed with a greater preset time, preset voltage, and preset current, and a display panel for a mobile phone or a tablet computer can be appointed with a lesser preset time, preset voltage, and preset current, but the embodiment is not limited to this.

Figure 3:
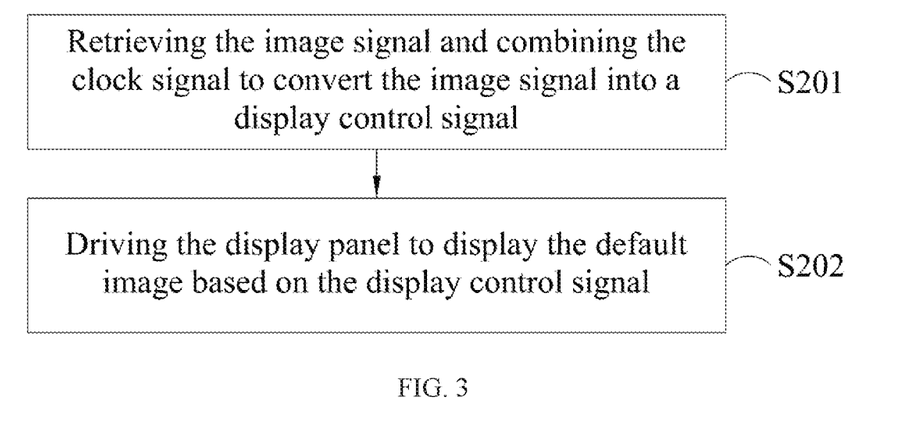
FIG. 3 is a flow chart to carry out step S103 provided in an embodiment of the present application.

As an embodiment shown in FIG. 3, the testing method of the display panel can further include the steps as follows.

A step S201 includes retrieving the image signal and combining the clock signal to convert the image signal into a display control signal.

Wherein, the image signal is converted into the display control signal based on the clock signal, and the display panel perform a display correspondingly based on the display control signal. To be specific, the display control signal is generated by a driver circuit on the display panel based on the image signal and the clock signal for the display panel to display the default image.

A step S202 includes driving the display panel to display the default image based on the display control signal.

In this step, the display panel displays the default image based on the generated display control signal in step S201. The step S202 can specifically be driving the display panel to display a plurality of different default images based on the display control signal, wherein each default image has a corresponding duration, a corresponding display sequence, and a corresponding number of its display times.

For example, under the control of the display control signal during the whole test procedure, the display panel displays a red image N1 times each with a duration of M1 seconds, and a green image N2 times each with a duration of M2 seconds, a blue image N3 times each with a duration of M3 second, and a grey image N4 time each with a duration of M4 seconds, and the display panel stop working N5 times each with a duration of M5 seconds. Wherein, N1, N2, N3, N4, and N5 can be equal, which means the display panel can, but not limited to, sequentially display the red image, the green image, the blue image, and the grey image, and stop working as the test sequence.

Optionally, before retrieving the image signal, the test procedure can further include detecting a test signal, and after the test signal is detected, providing a required power and the clock signal to the display panel, and retrieving the image signal.

In this embodiment, the test signal can be generated by an external device and sent to the display panel, and after the display panel detects the test signal, the display panel is provided with required power and clock signal, and the image signal is retrieved. In a practical embodiment, when the power and the clock signal provided by the external power to the display panel is detected, it is considered as the test signal that is being received, and then the image signal is retrieved. The embodiment is however not limited to this. In another practical embodiment, the test signal can be generated by a signal-generating device, and the display panel is provided with required power and clock signal by a power board, and the image signal pre-stored in the driver chip of the display panel is retrieved.

Optionally, the testing method of the display panel can further include measuring and recording performance parameters of the display panel.

It can be understood that, after the display panel being tested, the performance parameters of the display panel that went through the preset test are measured to evaluate the performance of the display panel. To be specific, the performance parameters such as, but not limited to, luminance or/and resolution, etc. of the display panel are measured.

Optionally, the testing method of the display panel can further include real-time measuring and recording the performance parameters of the display panel.

It can be understood that when testing the display panel, the performance parameters of the display panel can be real-time measured within several phases such that a problem can be immediately acknowledged before the end of the test. To be specific, the performance parameters such as, but not limited to, luminance or/and resolution, etc. of the display panel are measured.

In the aforementioned testing method for a display panel, the image signal is pre-stored in the driver chip of the display panel, and the driver chip can be directly accessed to retrieve the image signal during the test of the display panel, which discards the use of the TCON board for providing the image signal, thereby reducing the cost and resolving the issue of frequent damages of the TCON board after repeat uses in tests.

Figure 4:
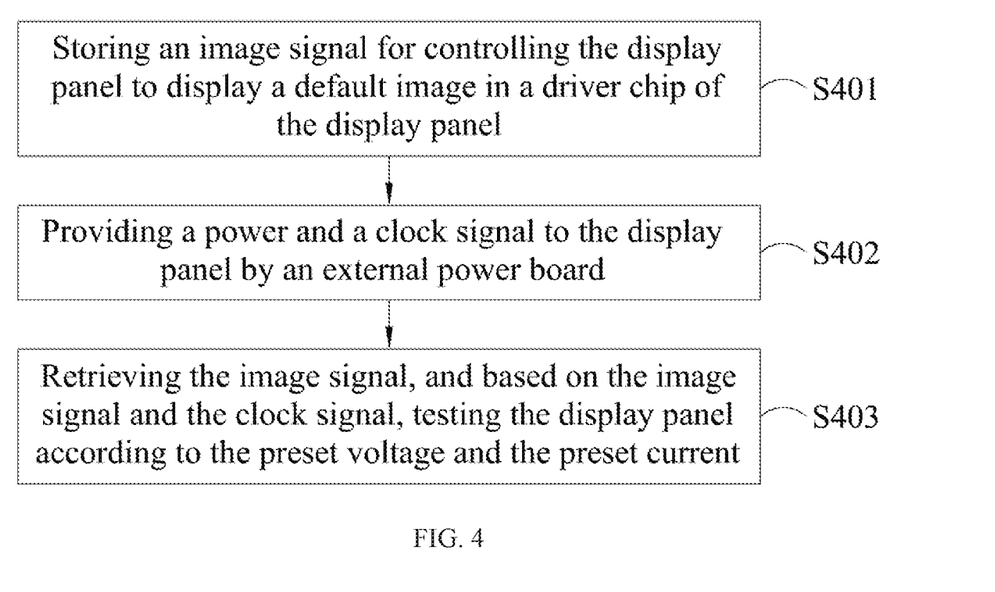
FIG. 4 is a schematic diagram showing another flow chart of a testing method for a display panel provided in an embodiment of the present application.

FIG. 4 illustrates a testing method for a display panel described as follows.

A step S401 includes storing an image signal for controlling the display panel to display a default image in a driver chip of the display panel.

In this embodiment, the image signal is capable to prompt the display panel to display the default image under the external power and the clock signal. For example, under the external power and the clock signal, the display panel displays an image having a certain color, a certain figure, several kinds of figures, etc.

Provided with the image signal through a TCON board, the display panel can be lit under the external power and the clock signal to display the default image. However, in this step, the image signal is pre-stored in the driver chip of the display panel, and the driver chip of the display panel is directly accessed to retrieve the image signal during testing the display panel, which discards the use of the TCON board for providing the image signal, thereby reducing the cost and resolving the issue of frequent damages of the TCON board after repeat uses in tests.

A step S402 includes providing a power and the clock signal to the display panel by an external power board.

To be specific, the power output leads of the power board connect the power input leads of the display panel through wiring, and the clock signal output leads of the power board connect the clock signal input leads of the display panel through wiring, and the power board supplies the required voltage, current, and the clock signal to the display panel for the test.

A step S403 includes retrieving the image signal and, based on the image signal and the clock signal, testing the display panel according to the preset voltage and the preset current.

In some embodiments, the step of testing the display panel according to the preset test condition can specifically be testing the display panel according to a preset time.

Wherein, time requirement for testing each display panel can be preset to perform a preset time test on the display panel for verifying the performance of the display panel. In this embodiment, the preset time is given based on practical situations, and different kinds of display panels have their corresponding preset times different. For example, a display panel for a display device can be appointed with a longer preset time, and a display panel for a mobile phone, or a tablet computer can be appointed with a shorter preset time, but the embodiment is not limited to this.

Optionally, the step of testing the display panel according to the preset time can specifically be testing the display panel according to a duration of each default image, a display sequence of each default image, and a number of times of each default image.

Wherein, during the display panel test procedure, in order to have a more thorough and accurate test on the display panel, the display panel may be required to display different default images with each default image having a corresponding duration, a position in the sequence, and a corresponding number of times being displayed.

For example, during the test procedure, the display panel is required to display a red image N1 times each with a duration of M1 seconds, a green image N2 times each with a duration of M2 seconds, a blue image N3 times each with a duration of M3 seconds, and a grey image N4 times each with a duration of M4 seconds, and to stop working N5 times each with a duration of M5 seconds. Wherein, N1, N2, N3, N4, and N5 are equal, which means the display panel is tested with a sequence of, but not limited to, displaying the red image, the green, the blue image, and the grey image, and stopping working.

In another embodiment, the step of testing the display panel according to the preset test condition can specifically be testing the display panel according to the preset voltage and the preset current.

Wherein, voltage and current requirements for testing each display panel can be preset to perform preset voltage and preset current tests on the display panel for verifying the performance of the display panel. In this embodiment, the preset voltage and preset current can be set up based on practical situations, and different kinds of display panels have their corresponding preset voltages and preset currents totally or partially different. For example, a display panel for a display device can be appointed with a greater preset voltage and preset current, and a display panel for a mobile phone or a tablet computer can be appointed with a lesser preset voltage and preset current, but the embodiment is not limited to this.

Moreover, the preset time, preset voltage, and the preset current can be combined to test the display panel. Specifically, the preset time, preset voltage, and the preset current are given based on practical situations, and different kinds of display panels have their corresponding preset time, preset voltages, and preset currents totally or partially different. For example, a display panel for a display device can be appointed with a greater preset time, preset voltage, and preset current, and a display panel for a mobile phone or a tablet computer can be appointed with a lesser preset time, preset voltage, and preset current, but the embodiment is not limited to this.

Optionally, the testing method for a display panel can further includes:

retrieving the image signal and combining the clock signal to convert the image signal into a display control signal, and driving the display panel to display the default image based on the display control signal.

Wherein, the image signal is converted into the display control signal based on the clock signal, and the display panel perform a display correspondingly based on the display control signal. To be specific, the display control signal is generated by a driver circuit on the display panel based on the image signal and the clock signal for the display panel to display the default image.

The display panel is driven to display the default image based on the generated display control signal. To be specific, the step of driving the display panel to display the default image based on the generated display control signal can specifically be driving the display panel to display a plurality of different default images based on the display control signal, wherein each default image has a corresponding duration, a corresponding display sequence, and a corresponding number of its display times.

For example, under the control of the display control signal during the whole test procedure, the display panel displays a red image N1 times each with a duration of M1 seconds, and a green image N2 times each with a duration of M2 seconds, a blue image N3 times each with a duration of M3 second, and a grey image N4 time each with a duration of M4 seconds, and the display panel stop working N5 times each with a duration of M5 seconds. Wherein, N1, N2, N3, N4, and N5 can be equal, which means the display panel can, but not limited to, sequentially display the red image, the green image, the blue image, and the grey image, and stop working as the test sequence.

Optionally, before retrieving the image signal, the test procedure can further include detecting a test signal, after the test signal is detected, providing a required power and the clock signal to the display panel, and retrieving the image signal.

In this embodiment, the test signal can be generated by an external device and sent to the display panel, and after the display panel detects the test signal, the display panel is provided with required power and clock signals, and the image signal is retrieved. In a practical embodiment, when the power and the clock signal provided by the external power to the display panel is detected, it is considered as the test signal that is being received, and then the image signal is retrieved. The embodiment is however not limited to this. In another practical embodiment, the test signal can be generated by a signal-generating device, and the display panel is provided with required power and clock signals by a power board, and the image signal pre-stored in the driver chip of the display panel is retrieved.

Optionally, the testing method of the display panel can further include measuring and recording performance parameters of the display panel.

It can be understood that, after the display panel being tested, the performance parameters of the display panel that went through the preset test are measured to evaluate the performance of the display panel. To be specific, the performance parameters such as, but not limited to, luminance or/and resolution, etc. of the display panel are measured.

Optionally, the testing method of the display panel can further include real-time measuring and recording the performance parameters of the display panel.

It can be understood that when testing the display panel, the performance parameters of the display panel can be real-time measured within several phases such that a problem can be immediately acknowledged before the end of the test. To be specific, the performance parameters such as, but not limited to, luminance or/and resolution, etc. of the display panel are measured.

It should be understood that the serial numbers of each step in the aforementioned embodiments do not indicate their execution orders, and the steps execution order should be defined based on their functions and internal logic and should not constitute any limitation to the procedure in the embodiments of the present application.

Figure 5:
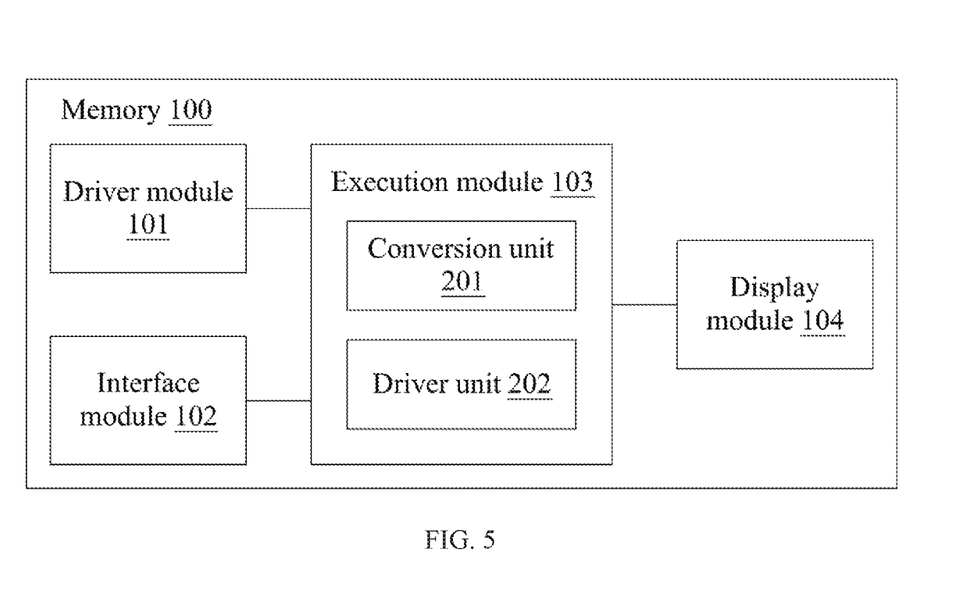
FIG. 5 a structure diagram showing a memory in a display device provided in an embodiment of the present application.

Corresponding to the testing methods for a display panel in the aforementioned embodiments, FIG. 5 illustrates a structure diagram of the display panel provided in this embodiment. For facilitating the description, only the portions related to the present embodiment are shown.

The display device includes a control device and a display panel. The control device is configured to store an image signal for controlling the display panel to display a default image. The control device is further configured to connect an external power and a clock signal for providing a power and the clock signal to the display panel. The control device is further configured to retrieve the image signal and test the display panel based on the image signal and the clock signal according to a preset test condition. The display panel is configured to display the default image based on a control of the control device.

As shown in FIG. 5, the display device 100 includes a control device, wherein the control device is configured to execute the following program modules stored in a memory: a driver module 101, an interface module 102, an execution module 103, and a display panel 104.

To be specific, the driver module 101 is configured to store the image signal for controlling the display panel 104 to display the default image.

The interface module 102 is configured to connect the external power and the clock signal for providing the power and the clock signal to the display panel 104.

The execution module 103 is configured to retrieve the image signal and test the display panel 104 based on the image signal and the clock signal according to the preset test condition.

The display panel 104 is configured to display the default image based on the control of the execution module 103.

Optionally, the execution module 103 can generate an image-display instruction based on the image signal and the clock signal according to the preset test condition and send the instruction to the display module 104, and the display module 104 displays the default image based on the image-display instruction.

Optionally, the execution module 103 can include a conversion unit 201 and a driver unit 202.

To be specific, the conversion unit 201 is configured to retrieve the image signal and convert the image signal into a data voltage.

The driver unit 202 is configured to drive the display panel 104 to display the default image based on the data voltage and the clock signal.

In this embodiment, the display panel 104 connects a power board, which provides the power and the clock signal to the display panel 104. The display panel can be a LCD display panel, an OLED (Organic Light-Emitting Diode) display panel, or other kinds of display panels.

Figure 6:
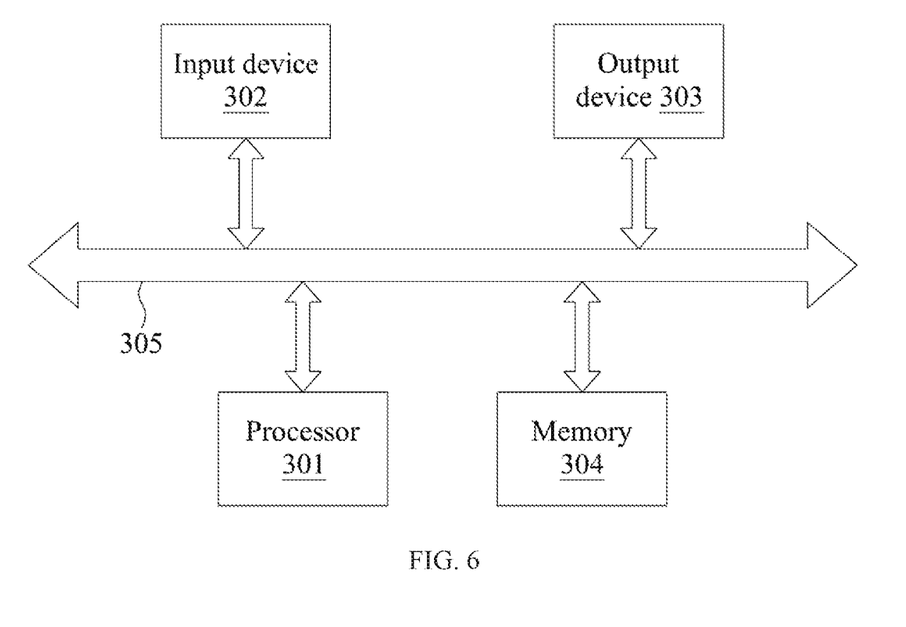
FIG. 6 is a schematic diagram showing a structure of a display device provided in an embodiment of the present application.

FIG. 6 illustrates a structural diagram of a display device provided in the embodiment of the present application. As shown in FIG. 6, the display device includes one or more processors 301 (only one shown in the figure), one or more input devices 302 (only one shown in the figure), one or more output devices 303 (only one shown in the figure), a memory 304, and a display panel (not shown in the figure). The processor 301, the input device 302, the output device 303, and the memory 304 are coupled through a bus 305. The memory 304 is configured to store instructions, and the processor 301 is configured to execute the instructions stored in the memory 304.

Wherein, the processor 301 is configured to store an image signal that is configured to control the display panel to display a default image. The processor 301 is further configured to connect an external power and a clock signal through the input device 302 and the output device 303 for providing the power and the clock signal to the display panel. The processor 301 is further configured to retrieve the image signal and test the display panel based on the image signal and the clock signal according to a preset test condition. The display panel is configured to display the default image based on a control of the processor 301.

Optionally, the processor 301 is specifically configured to retrieve the image signal and convert the image signal into a data voltage and drive the display panel to display the default image based on the data voltage and the clock signal.

For the sake of convenience and simplicity, the above only provides description and examples on the aforementioned divided functional units and modules, but practically, one can assign the aforementioned functions to be accomplished by different functional units and modules, into which the device is divided, to accomplish total or partial aforementioned functions. The functional units and modules can be integrated into a single processing unit, or they can be physically individual, or two or more than two of them can be integrated into a single unit. The integrated single unit can be applied in the form of hardware or in the form of software functional unit. In addition, the name of each function unit or module is for a purpose to distinguish one and another and should not be construed as limited to the protected scope of the present application. The working procedure of units and modules in the aforementioned system can refer to the corresponding procedure described in the method embodiments. The description therefore is not repeated.

In combination with the examples described in the embodiments disclosed in this specification, units and algorithm steps may be implemented by electronic hardware, computer software, or a combination thereof. Whether the functions are performed in a form of hardware or software depends on particular applications and design constraint conditions of the technical solutions. A person skilled in the art may use different methods to implement the described functions for each particular application, but it should not be considered that the implementation goes beyond the scope of the present disclosure.

In the several embodiments provided in the present application, it should be understood that the disclosed devices and methods may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the devices or units may be implemented in electronic, mechanical, or other forms.

The units described as separate parts may or may not be physically separate, and parts displayed as units may or may not be physical units, may be located in one position, or may be distributed on a plurality of network units. A part or all of the units may be selected according to actual needs to achieve the objectives of the solutions of the embodiments.

In addition, functional units in the embodiments of the present application may be integrated into one processing unit, or each of the units may exist alone physically, or two or more units are integrated into one unit. The integrated unit may be implemented in a form of hardware, or may be implemented in a form of a software functional unit.

When the integrated unit is implemented in a form of a software function unit and sold and used as an independent product, it may be stored in a computer-readable medium. Based on such an understanding, the technical solutions of the embodiment of the present application essentially, or the part contributing to the current techniques, or all or a part of the technical solutions may be implemented in the form of a software product. The software product is stored in a storage medium and includes several instructions for instructing a computer device (which may be a personal computer, a server, or a network device) or a processor to perform all or a part of the steps of the methods described in the embodiments of the present application. The foregoing storage medium includes any medium that can store program code, such as a universal serial bus (USB) flash drive, a removable hard disk, a read-only memory (ROM), a random access memory (RAM), a magnetic disk, or an optical disc.

The foregoing descriptions are merely embodiments of the present application, and are not intended to limit the scope of the present application. Although the present application is described in detail with reference to the foregoing embodiments, persons of ordinary skill in the art should understand that they can still make modifications on the technical solutions recorded in the above embodiments, or perform equivalent replacements on a part of technical features thereof. These modifications or replacements will not make the essences of the corresponding technical solutions depart from the spirit and scope of the technical solutions of the embodiments of the present application and should be within the protection scope of the present application.

What is claimed is:

1. A testing method for a display panel, comprising the steps of:
    storing an image signal for controlling the display panel to display a default image in a driver chip of the display panel;
    providing a power signal and a clock signal for the display panel;
    retrieving the image signal without using a timer-control-register board and testing the display panel based on the image signal and the clock signal according to a preset test condition.

2. The testing method for the display panel of claim 1, wherein the step of testing the display panel according to the preset test condition is to test the display panel according to a preset time.

3. The testing method for the display panel of claim 2, wherein different kinds of display panels correspond to different preset times, and a time requirement for the test is preset for each kind of display panels.

4. The testing method for the display panel of claim 2, wherein the step of testing the display panel according to the preset time is to test the display panel according to a duration of each default image, a display sequence of each default image, and a number of times of each default image.

5. The testing method for the display panel of claim 1, wherein the step of testing the display panel according to the preset test condition is to test the display panel according to a preset voltage and a preset current.

6. The testing method for the display panel of claim 1, wherein the step of testing the display panel according to the preset test is to test the display panel according to a preset time, a preset voltage, and a preset current.

7. The testing method for the display panel of claim 1, before retrieving the image signal, further comprising:
    detecting a test signal, and after the test signal is detected, providing the power and clock signals required by the display panel, and retrieving the image signal.

8. The testing method for the display panel of claim 1, further comprising:
    retrieving the image signal and combining the clock signal to convert the image signal into a display control signal; and
    driving the display panel to display the default image based on the display control signal.

9. The testing method for the display panel of claim 8, wherein the step of driving the display panel to display the default image based on the display control signal is to drive the display panel to display a plurality of different default images based on the display control signal, wherein each default image has a corresponding duration, a corresponding display sequence, and a corresponding number of display times.

10. The testing method for the display panel of claim 1, further comprising:

measuring and recording a performance parameter of the display panel.

11. The testing method for the display panel of claim 10, wherein the step of measuring and recording a performance parameter of the display panel is to measure and record a luminance and/or a resolution of the display panel.

12. The testing method for the display panel of claim 1, further comprising:
   real-time measuring and recording a performance parameter of the display panel.

13. The testing method for the display panel of claim 1, wherein the power and clock signals are provided to the display panel by an external power board.

14. A display device, comprising:
   a control device, configured to store an image signal for controlling a display panel to display a default image,
   wherein the control device is further configured to connect an external power and a clock signal to provide a power and the clock signal to the display panel, and
   the control device is further configured to retrieve the image signal without using a timer-control-register board and test the display panel based on the image signal and the clock signal according to a preset test condition; and
   the display panel, which is configured to display the default image based on a control of the control device.

15. The display device of claim 14, wherein the control device is configured to retrieve the image signal and covert the image signal in to a data voltage and drive the display panel to display the default image based on the data voltage and the clock signal.

16. The display device of claim 14, wherein the control device is further configured to store the image signal for controlling the display panel to display the default image; and connect the external power and the clock signal to provide the power and the clock signal to the display panel; and retrieve the image signal and test the display panel based on the image signal and the clock signal according to the preset test condition; and display the default image based on a control of an execution module.

17. The display device of claim 16, wherein the control device is further configured to retrieve the image signal and convert the image signal into a data voltage; and drive the display panel to display the default image based on the data voltage and the clock signal.

18. A testing method for a display panel, comprising the steps of:
   storing an image signal for controlling the display panel to display a default image in a driver chip of the display panel;
   providing a power signal and a clock signal to the display panel by an external power board; and
   retrieving the image signal without using a timer-control-register board and testing the display panel based on the image signal and the clock signal according to a preset voltage and a preset current.

19. The testing method for the display panel of claim 18, further comprising:
   retrieving the image signal and combining the clock signal to convert the image signal into a display control signal; and
   driving the display panel to display the default image based on the display control signal.

20. The testing method for the display panel of claim 19, wherein the step of driving the display panel to display the default image based on the display control signal is to drive the display panel to display a plurality of different default images based on the display control signal, wherein each default image has a corresponding duration, a corresponding display sequence, and a corresponding number of display times.

* * * * *